United States Patent
Cai et al.

(10) Patent No.: US 9,437,711 B2
(45) Date of Patent: Sep. 6, 2016

(54) METHODS OF FORMING GATE STRUCTURES FOR SEMICONDUCTOR DEVICES USING A REPLACEMENT GATE TECHNIQUE AND THE RESULTING DEVICES

(71) Applicant: GLOBALFOUNDRIES Inc., Grand Cayman (KY)

(72) Inventors: Xiuyu Cai, Niskayuna, NY (US); Xunyuan Zhang, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 263 days.

(21) Appl. No.: 14/081,019

(22) Filed: Nov. 15, 2013

(65) Prior Publication Data
US 2015/0137271 A1    May 21, 2015

(51) Int. Cl.
*H01L 29/66* (2006.01)
*H01L 29/78* (2006.01)

(52) U.S. Cl.
CPC ... *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 7,985,669 B2 | 7/2011 | Huotari et al. |
| 2007/0252223 A1* | 11/2007 | Lee ............. H01L 29/513 257/411 |
| 2012/0104509 A1* | 5/2012 | Matsumoto ..... H01L 21/823814 257/369 |

OTHER PUBLICATIONS

Kang et al., "Selective Deposition of Hafnium Oxide Nanothin Films on OTS Patterned Si(100) Substrates by Metal-Organic Chemical Vapor Deposition," IEEE Transactions on Nanotechnology, 5101-706, Nov. 2006.
Shin et al., "MOCVD of Titanium Nitride from a New Precursor, Ti[N(CH3)C2H5]4," Chem. Mater., 9:76-80, 1997.
Sung et al., "Formation of alkylsiloxane self-assembed monolayers on Si3N4," J. Vac. Sci. Technol. A, 17:540-544, Mar./Apr. 1999.

\* cited by examiner

*Primary Examiner* — Ali Naraghi
(74) *Attorney, Agent, or Firm* — Amerson Law Firm, PLLC

(57) ABSTRACT

One method disclosed herein includes, among other things, performing a process operation on an exposed surface of a substrate so as to form an H-terminated silicon surface, selectively forming a sacrificial material layer within a replacement gate cavity but not on the H-terminated silicon surface, forming a high-k layer of insulating material within the replacement gate cavity above the H-terminated silicon surface and laterally between first spaced-apart portions of the sacrificial material layer, and forming a work-function adjusting material layer in the gate cavity, wherein the work-function adjusting material layer has a substantially planar upper surface that extends between second spaced-apart portions of the sacrificial material layer formed on the sidewall spacers.

18 Claims, 12 Drawing Sheets

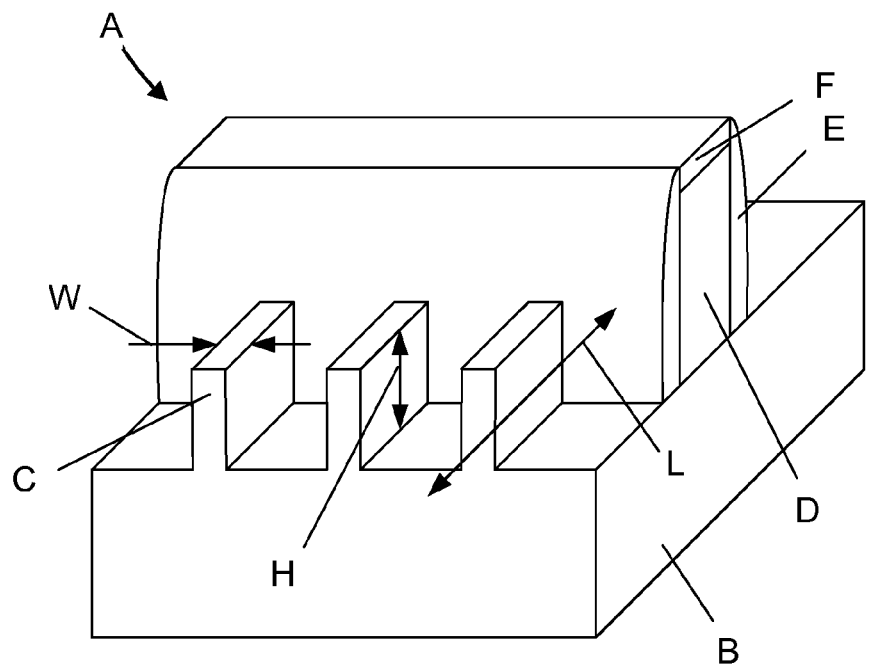
Figure 1A (Prior Art)
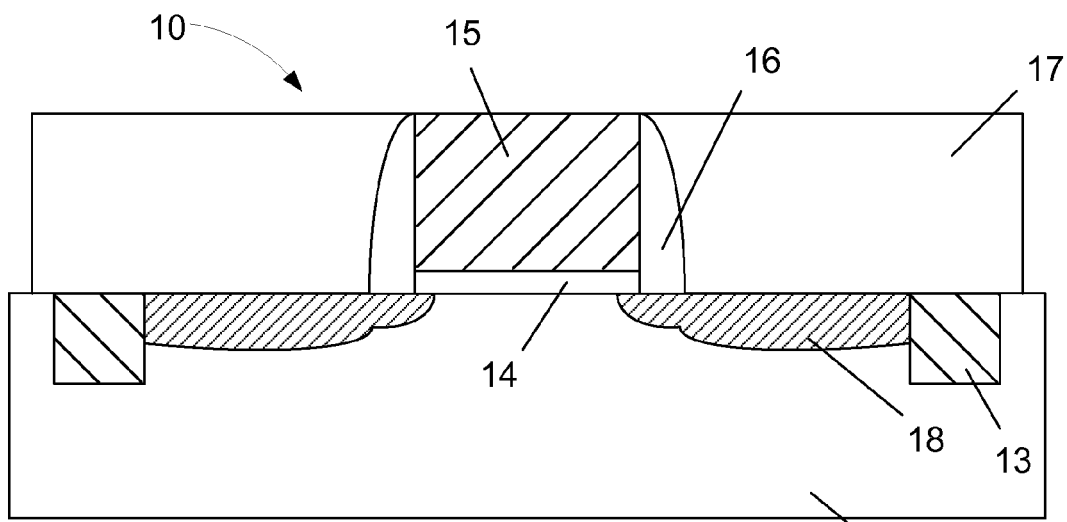
(Prior Art) Figure 1B

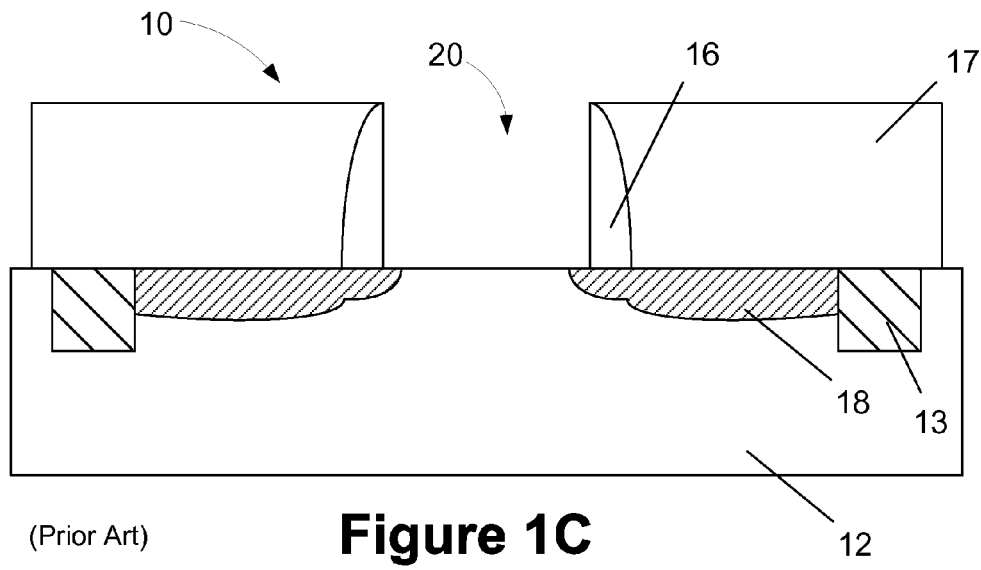
(Prior Art) Figure 1C
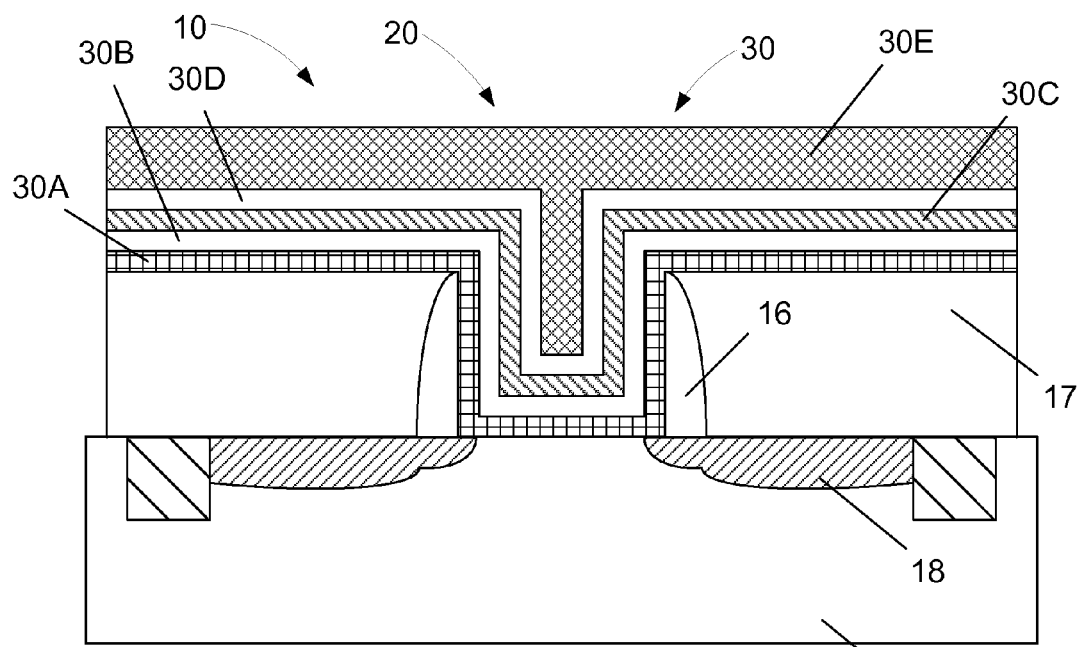
(Prior Art) Figure 1D

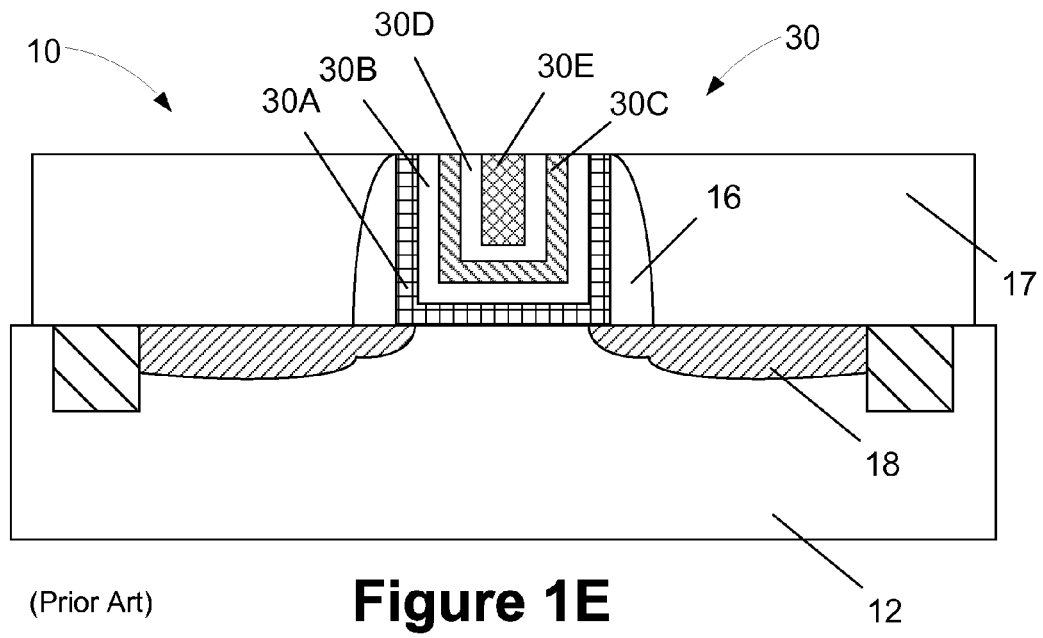
(Prior Art) Figure 1E
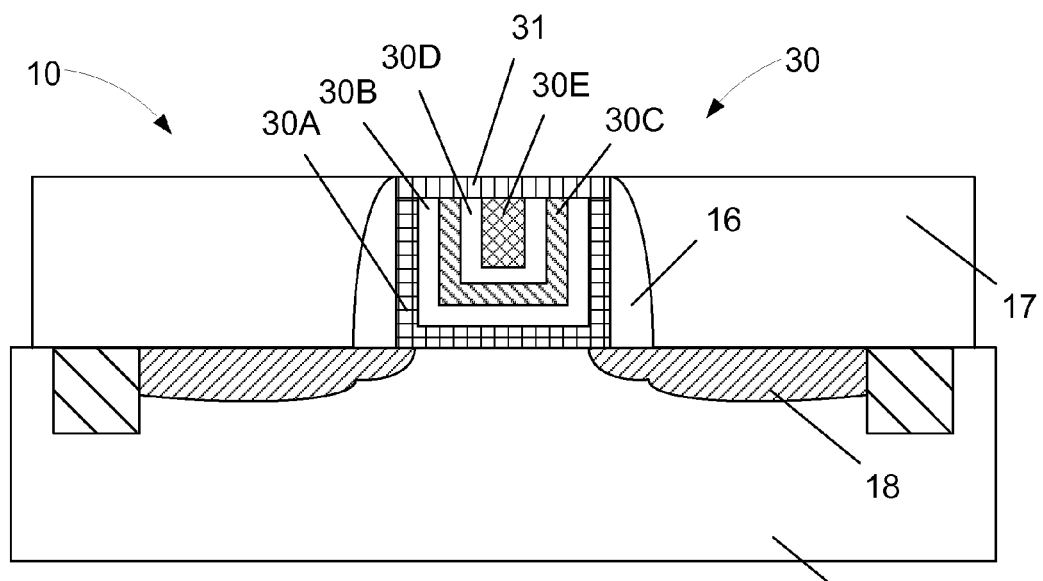
(Prior Art) Figure 1F

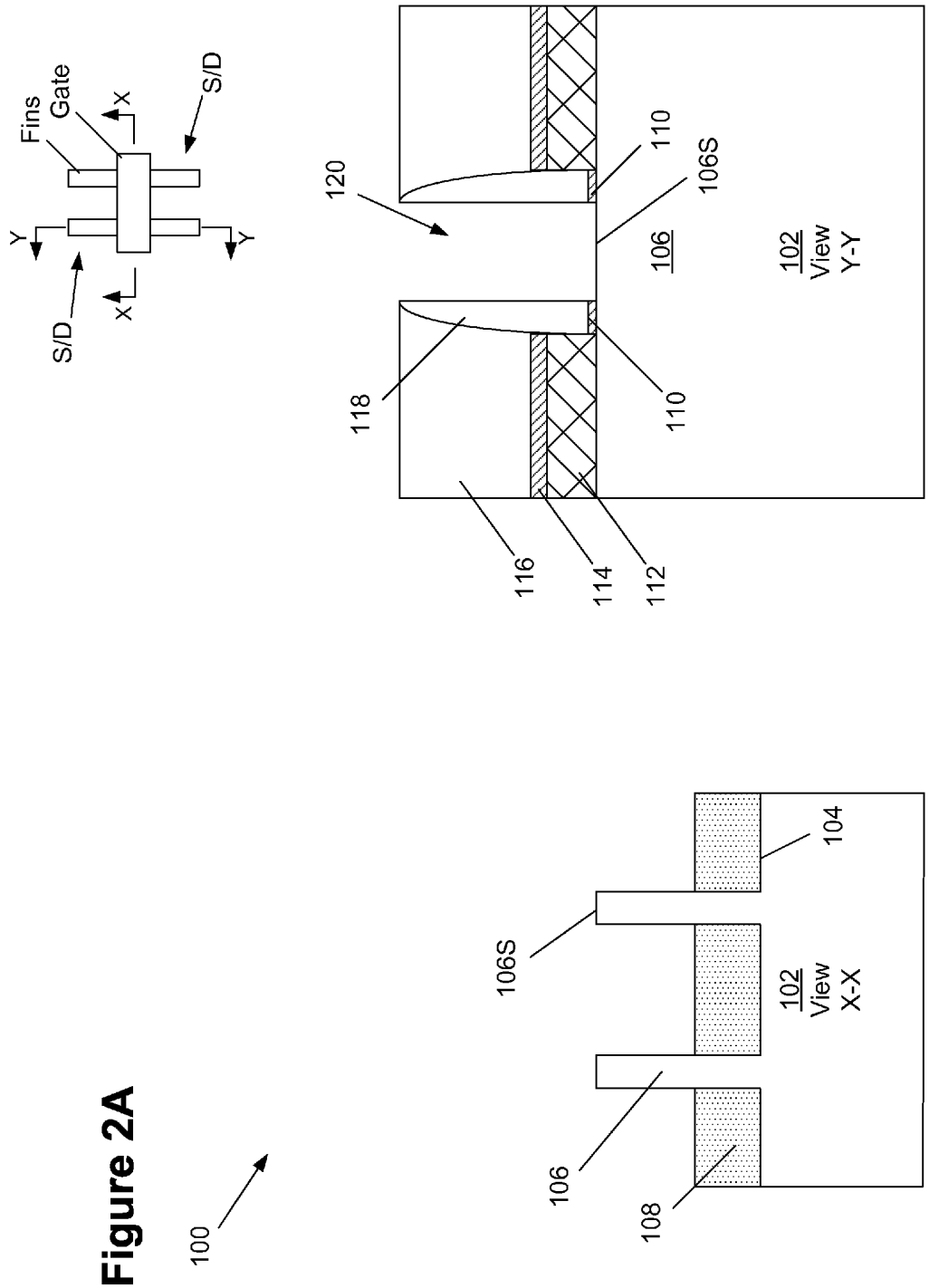

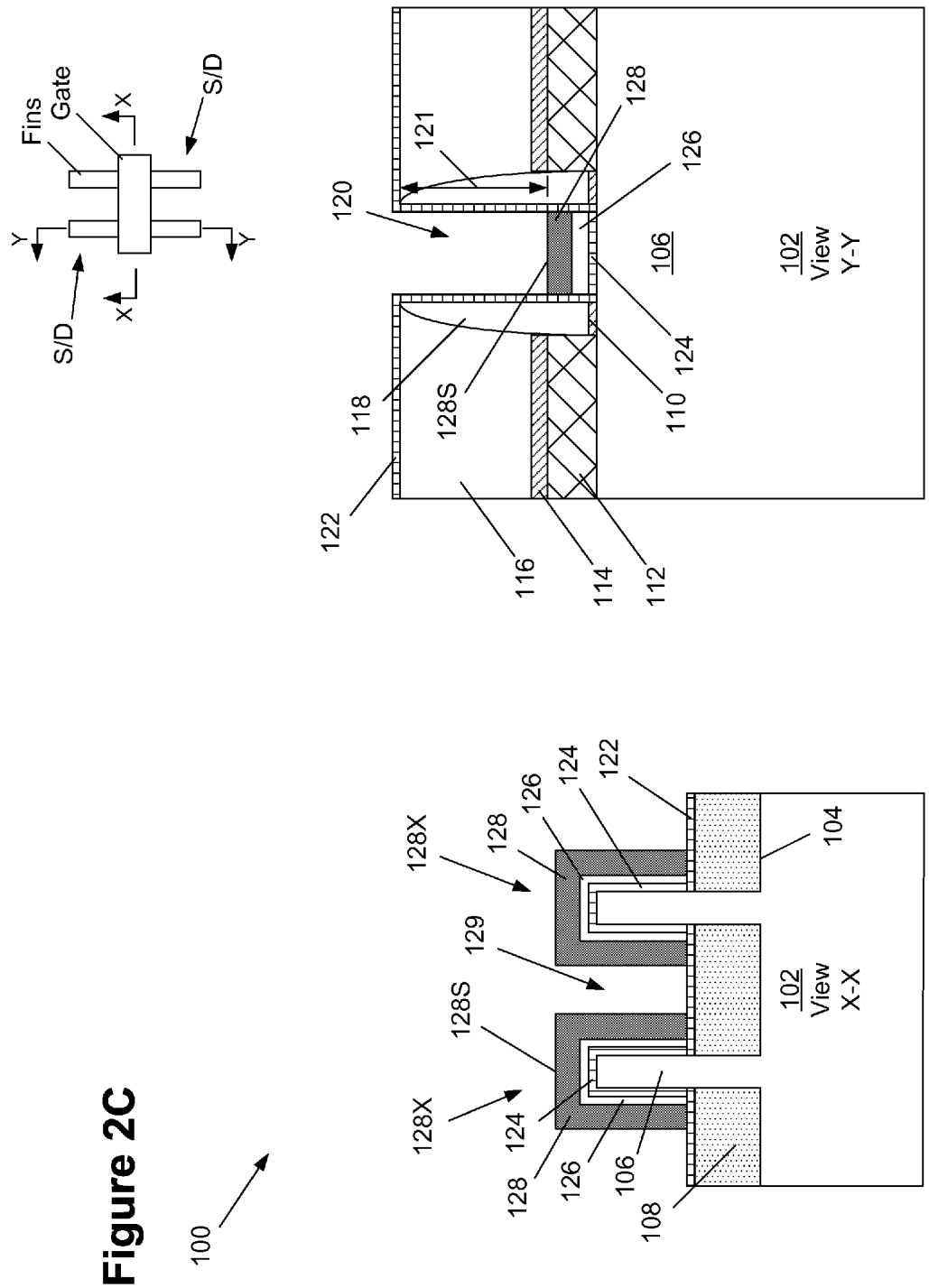

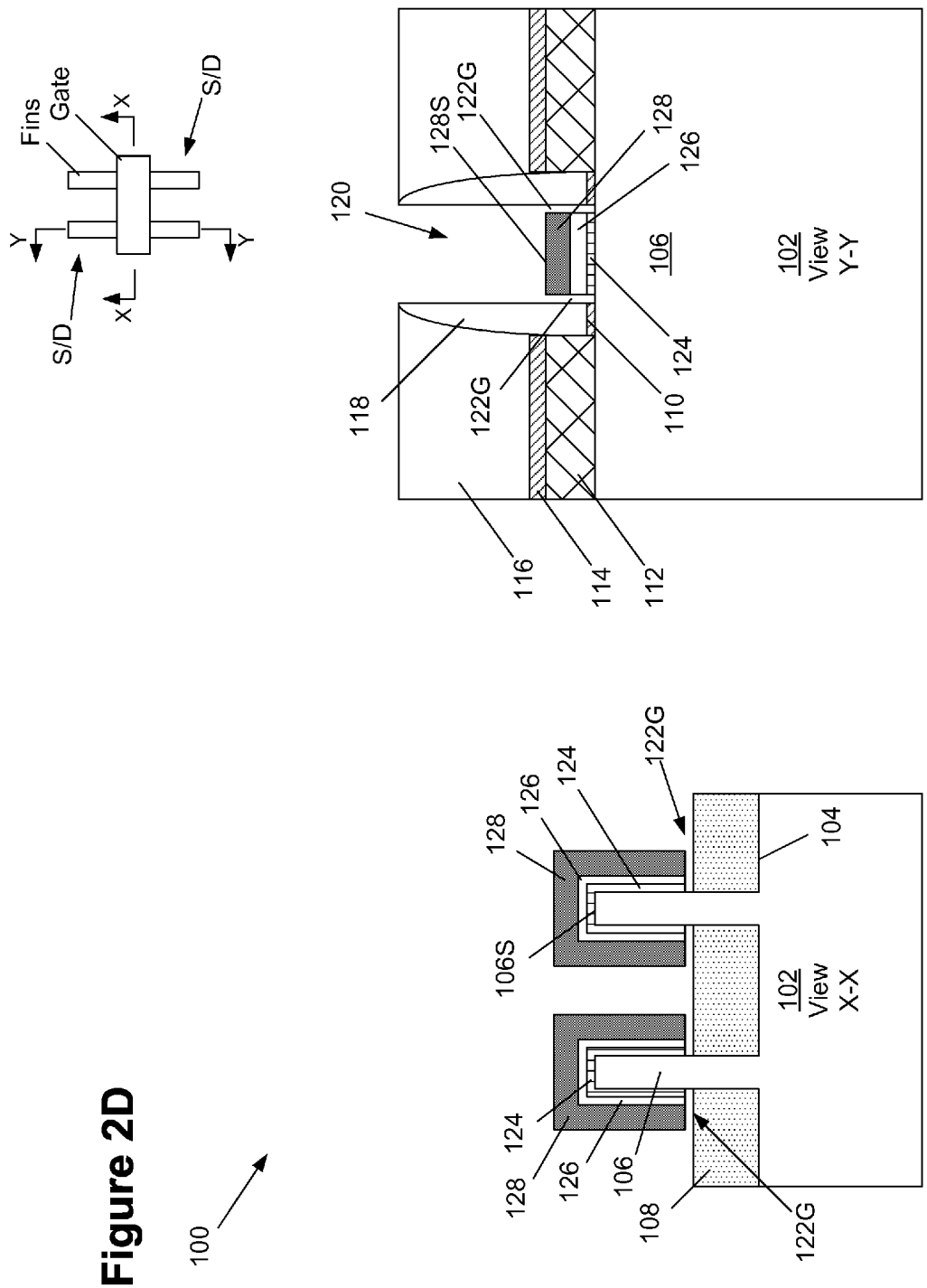

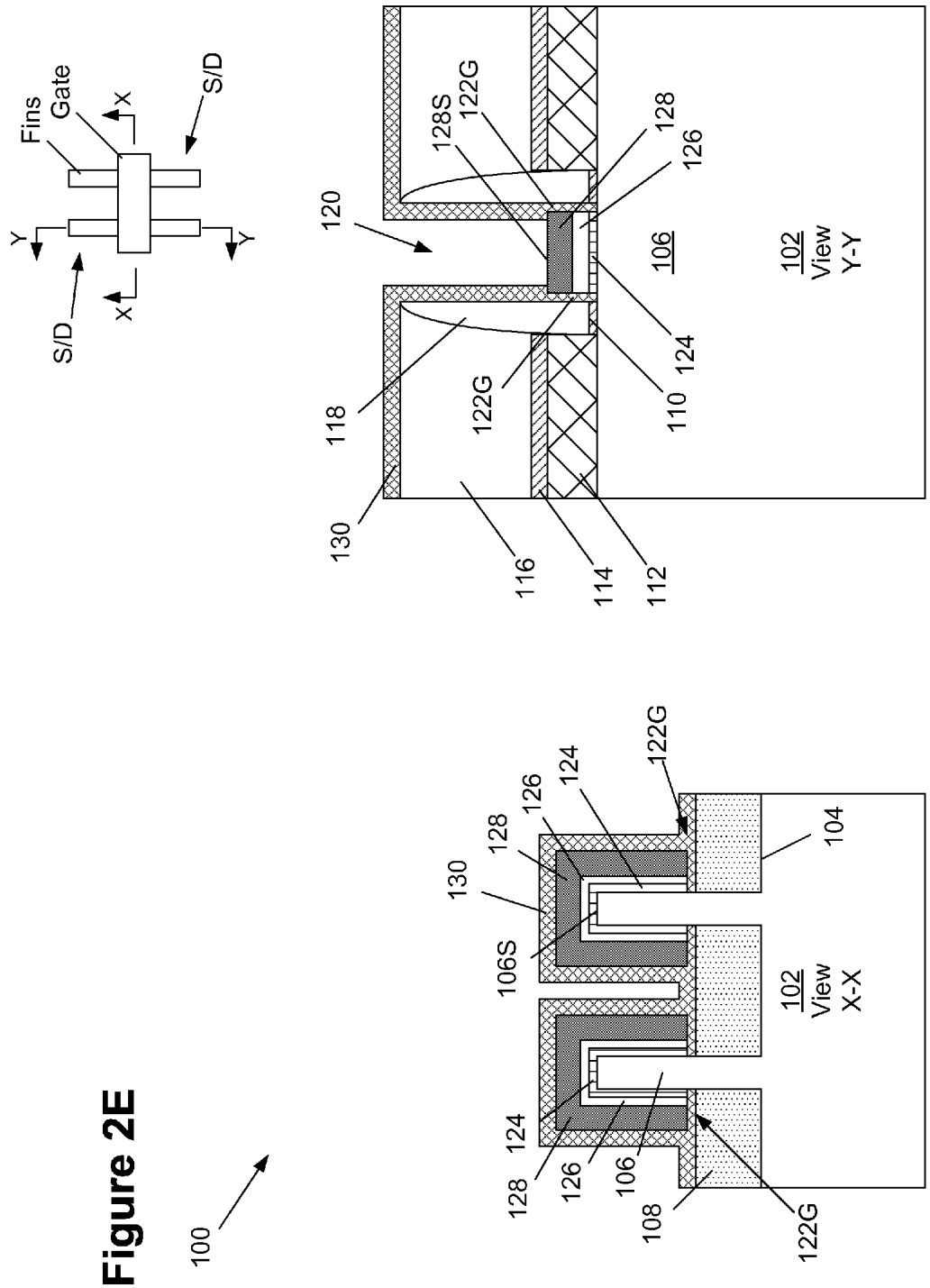

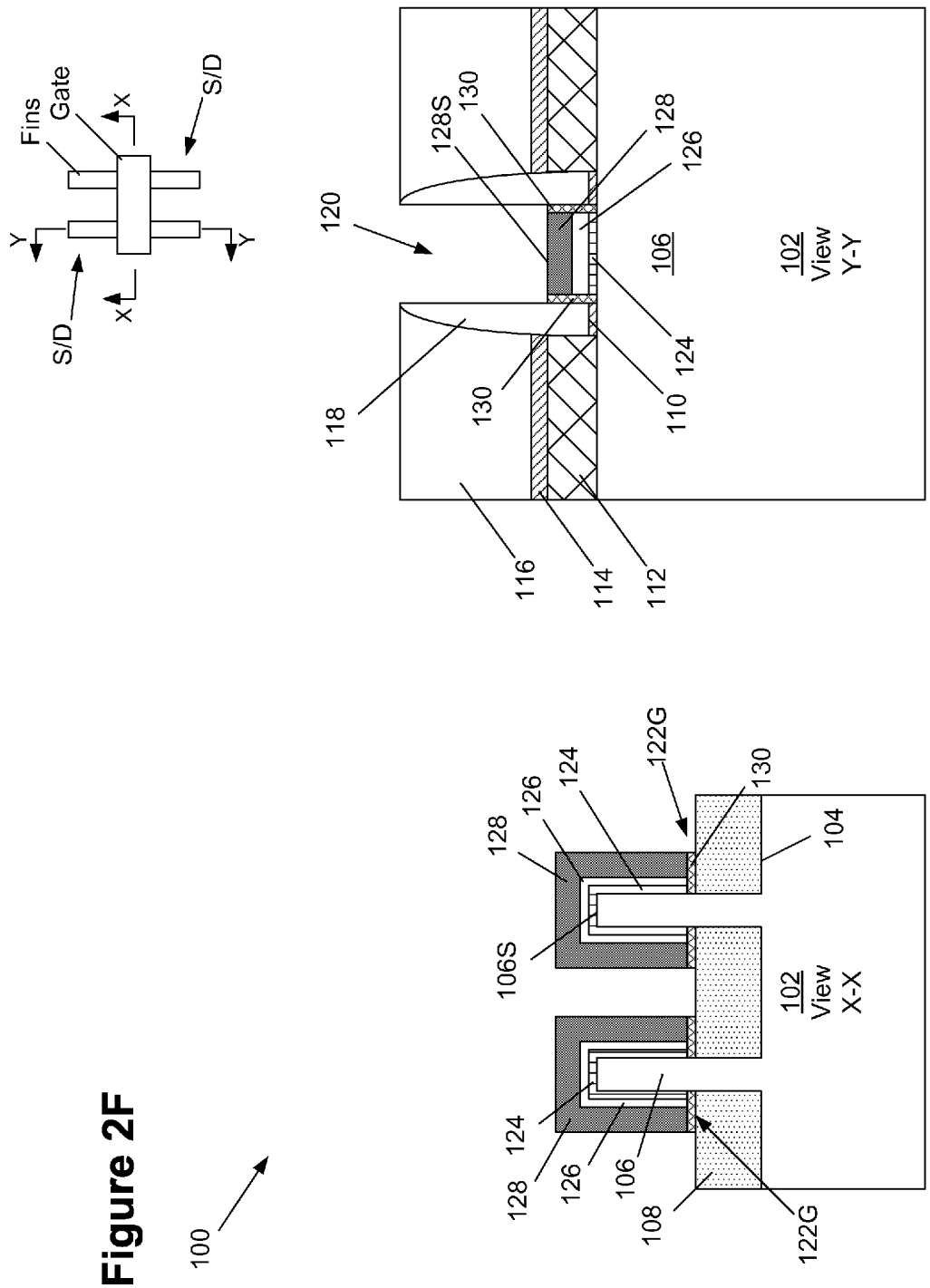

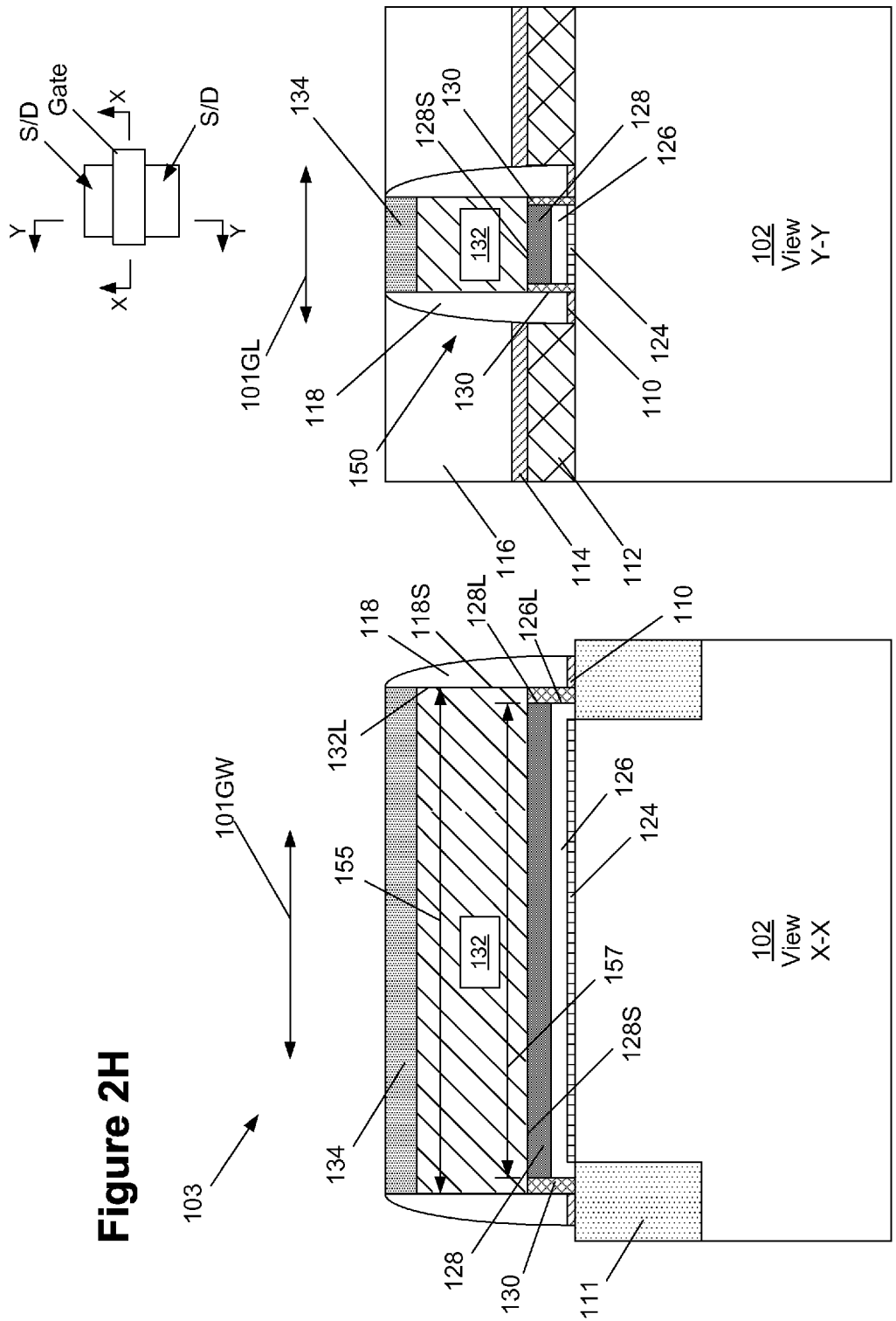

METHODS OF FORMING GATE STRUCTURES FOR SEMICONDUCTOR DEVICES USING A REPLACEMENT GATE TECHNIQUE AND THE RESULTING DEVICES

BACKGROUND OF THE INVENTION

1. Field of the Invention

The present disclosure generally relates to the fabrication of integrated circuits, and, more particularly, to various methods of forming gate structures for semiconductor devices, such as transistors, using a replacement gate technique, and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size.

In the FinFET device, the gate structure D may enclose both the sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures D for such FinFET devices may be manufactured using so-called "gate-first" or "replacement gate" (gate-last) manufacturing techniques.

For many early device technology generations, the gate structures of most transistor elements (planar and FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1B-1G simplistically depict one illustrative prior art method for forming an HK/MG replacement gate structure using a replacement gate technique on a planar transistor device. As shown in FIG. 1B, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a replacement gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1D, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and, thereafter, performing a CMP process to remove excess portions of the gate cap material layer positioned above the surface of the layer of insulating material 17. The gate cap layer 31 is formed so as to protect the underlying gate materials during subsequent processing operations.

As the gate length of transistor devices has decreased, the physical size of the gate cavity 20 has also decreased. Thus, it is becoming physically difficult to fit all of the layers of material needed for the replacement gate structure 30 within such reduced-size gate cavities, particularly for NMOS devices, due to the greater number of layers of material that are typically used to form the gate structures for the NMOS devices. For example, as gate lengths continue to decrease, voids or seams may be formed as the various layers of material are deposited into the gate cavity 20. FIG. 1G is a somewhat enlarged view of an illustrative NMOS device that is provided in an attempt to provide the reader with some idea of just how limited the lateral space 20S is within the gate cavity 20 of an NMOS device as the various metal layers 30A-30D are formed in the gate cavity 20. In FIG. 1G, the internal sidewall surfaces of the spacers 16 define a gate cavity 20 having a substantially uniform width 20S throughout the height or depth of the gate cavity 20. As the layers of material in the gate stack for the device are formed in the cavity 20, the remaining space 39 within the gate cavity 20 becomes very small. As the latter metal layers are formed, the lateral space 39 may be about 1-2 nm in width or even smaller. In some cases, the space 39 may be essentially non-existent. This may lead to so-called "pinch-off" of metal layers such that voids or seams may be formed in the overall gate stack, which may result in devices that perform at levels less than anticipated or, in some cases, the formation of devices that are simply not acceptable and have to be discarded.

When manufacturing advanced integrated circuit products using replacement gate structures, particularly in situations where the products also include very tight spacing between source/drain contact structures, such as products using self-aligned source/drain contacts, some amount of the work function metals in the gate cavity 20 must be removed from the gate cavity 20 to make room for additional materials, i.e., to make room within the upper portion of the gate cavity 20 for a bulk conductor material, such as tungsten and aluminum, and a gate cap layer. This process operation is sometimes referred to as work-function chamfering. In such a work-function chamfering process, some form of a protective material must be formed in the gate cavity 20 above the metal layer 30D to protect desired portions of the underlying metal layers during the recess etching process. If the lateral space 39 (to the extent it exists) cannot be reliably filled with such a protective material, such as a flowable oxide material, then the recessing etching process cannot be performed for fear of removing undesired portions of the metal layers during the course of performing the recess etching process.

Over recent years, due to the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements.

As device dimensions have decreased, the conductive contact elements in the contact level, e.g., source/drain contacts, have to be provided with critical dimensions in the same order of magnitude. For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the source/drain regions of the transistors, thereby providing self-aligned trenches which are substantially laterally delineated by the spacer structures of the gate electrode structures.

The present disclosure is directed to various methods of forming gate structures for semiconductor devices, such as transistors, using a replacement gate technique, and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming gate structures for semiconductor devices, such as transistors, using a replacement gate technique, and the resulting semiconductor devices. One method disclosed herein includes, among other things, performing at least one first etching process to remove a sacrificial gate structure positioned between two spaced-apart sidewall spacers so as to thereby define a replacement gate cavity that exposes a surface of the substrate, performing a process operation on the exposed surface of the substrate so as to form an H-terminated silicon surface, selectively forming a sacrificial material layer at least on internal surfaces of the sidewall spacers within the replacement gate cavity but not on the H-terminated silicon surface, forming a high-k layer of insulating material within the replacement gate cavity above the H-terminated silicon surface and laterally between first spaced-apart portions of the sacrificial material layer formed on the sidewall spacers, and forming at least one work-function adjusting metal layer above the high-k layer of insulating material and laterally between second spaced-apart portions of the sacrificial material layer formed on the sidewall spacers, wherein the at least one work-function adjusting metal has a substantially planar upper surface that extends between the second spaced-apart portions of the sacrificial material layer formed on the sidewall spacers. In one embodiment, the sacrificial material layer may be a sacrificial alkylsiloxane layer that may be formed by performing a directed self-assembly process.

One illustrative device disclosed herein includes, among other things, a high-k gate insulation layer positioned above a surface of a semiconductor substrate between two spaced-apart sidewall spacers, a work-function adjusting material layer positioned above the high-k gate insulation layer between the two spaced-apart sidewall spacers, wherein the work-function adjusting material layer has a substantially planar upper surface that extends across the entirety of the work-function adjusting material layer, wherein the high-k gate insulation layer and the work-function adjusting material layer have a first lateral width in a gate-length direction of the device, a bulk conductive material layer positioned above the substantially planar upper surface of the work-function adjusting material layer, wherein the bulk conductive material layer has a second lateral width in the gate-length direction of the device that is greater than the first lateral width, and a gate cap layer positioned above the bulk conductive material layer.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1G depict one illustrative prior art method of forming a gate structure of a transistor using a so-called "replacement gate" technique;

FIGS. 2A-2H depict various illustrative methods disclosed herein for forming gate structures for semiconductor devices using a replacement gate technique and the resulting semiconductor devices.

Figure 1G:
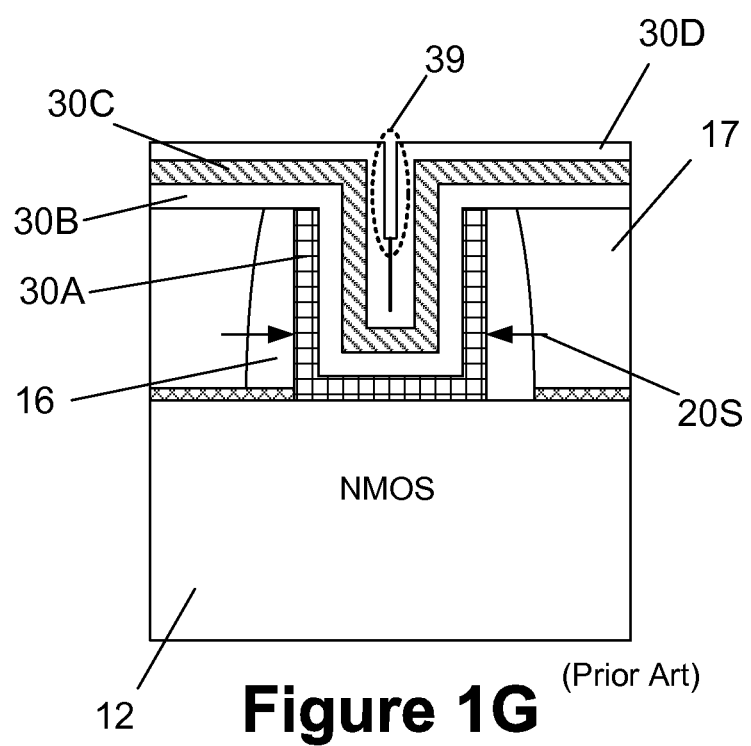

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming gate structures for semiconductor devices using a replacement gate technique. The replacement gate structure that will be depicted herein is intended to be representative in nature of any type of gate structure that may be employed in manufacturing integrated circuit products using so-called gate-last (replacement gate) manufacturing techniques. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Of course, the inventions disclosed herein should not be considered to be limited to the illustrative examples depicted and described herein. With reference to the attached figures, various illustrative embodiments of the methods and devices disclosed herein will now be described in more detail.

As will be appreciated by those skilled in the art after a complete reading of the present application, the methods and structures disclosed herein may be used when forming either planar or 3D transistor devices. An illustrative device 100 in the form of a FinFET device will be depicted for purposes of disclosing the subject matter set forth herein. Additionally, various doped regions, e.g., source/drain regions, halo implant regions, well regions and the like, are not depicted in the attached drawings. Of course, the inventions disclosed herein should not be considered to be limited to the illustrative examples depicted and described herein. Moreover, the transistor devices that are depicted in the attached drawings may be either NMOS or PMOS devices. In general, the drawings contain a plan view and various cross-sectional views that are taken where indicated in the plan view. The plan view in FIG. 2A depicts a product or device 100 comprised of two illustrative fins 106, although the methods disclosed herein may be employed in manufacturing a FinFET device comprised of any number of fins. The view "X-X" is a cross-sectional view that is taken through the long axis of the gate structures, i.e., a cross-sectional view through the gate structure in the gate-width direction of the transistor device. The view "Y-Y" is a cross-sectional view taken through the long axis of one of the fins 106 of the device 100 in the gate-length direction of the device. The illustrative transistor device 100 depicted in the drawings is formed above an illustrative substrate 102 that may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. Thus, the terms "substrate" or "semiconductor substrate" should be understood to cover all semiconducting materials and all forms of such materials.

FIG. 2A depicts the device 100 at a point in fabrication wherein several process operations have been performed. First, a plurality of trenches 104 were formed in the substrate 102 to thereby define a plurality of fins 106. The illustrative FinFET device disclosed herein will be depicted as being comprised of two illustrative fins 106. However, as will be recognized by those skilled in the art after a complete reading of the present application, the methods and devices disclosed herein may be employed when manufacturing FinFET devices having any number of fins, as well as planar transistor devices. In one embodiment, the trenches 104 were formed by performing an etching process through a patterned etch mask (not shown) e.g., a patterned hard mask layer, using known etching techniques. The patterned etch mask may be patterned using known sidewall image transfer techniques and/or photolithographic techniques, combined with performing known etching techniques. In some applications, a further etching process may be performed to reduce the width or to "thin" the fins 106, although such a thinning process is not depicted in the attached drawings.

For purposes of this disclosure and the claims, the use of the terms "fin" or "fins" should be understood to refer to fins that have not been thinned as well as fins that have been subjected to such a thinning etch process. Thereafter, a layer of insulating material 108 was deposited on the substrate 102 so as to over-fill the trenches 104. Then, a recess etching process was performed on the layer of insulating material 108 such that the insulating material 108 only remains in the bottom of the trenches 104 so as to locally isolate the fins 106 from one another. This recess etching process exposes the fins 106 in the source/drain regions and channel region of the device 100 to their approximate desired final fin height.

With continuing reference to FIG. 2A, the overall size, shape and configuration of the trenches 104 and fins 106 may vary depending on the particular application. The depth and width of the trenches 104 may vary depending upon the particular application. In one illustrative embodiment, based on current day technology, the depth of the trenches 104 may range from approximately 40-200 nm and the width of the trenches 104 may be about 15-60 nm. In some embodiments, the fins 106 may have a final width (at or near the bottom of the fin) within the range of about 5-20 nm. In the illustrative examples depicted in the attached figures, the trenches 104 and fins 106 are all of a uniform size and shape. However, such uniformity in the size and shape of the trenches 104 and the fins 106 is not required to practice at least some aspects of the inventions disclosed herein. In the example depicted herein, the trenches 104 are formed by performing an anisotropic etching process that results in the trenches 104 having a schematically depicted, generally rectangular configuration. In an actual real-world device, the sidewalls of the trenches 104 may be somewhat inwardly tapered, although that configuration is not depicted in the drawings. In some cases, the trenches 104 may have a reentrant profile near the bottom of the trenches 104. To the extent the trenches 104 are formed by performing a wet etching process, the trenches 104 may tend to have a more rounded configuration or non-linear configuration as compared to the generally rectangular configuration of the trenches 104 that are formed by performing an anisotropic etching process. Thus, the size and configuration of the trenches 104 and the fins 106, and the manner in which they are made, should not be considered a limitation of the present invention. For ease of disclosure, only the substantially rectangular trenches 104 and fins 106 will be depicted in subsequent drawings.

In the examples disclosed herein, the device 100 will be formed using a replacement gate technique. Accordingly, FIG. 2A depicts the device 100 at a point in fabrication wherein various process operations have been performed so as to result in the formation of a replacement gate cavity 120 in which the final replacement gate will be formed as described more fully below. In general, prior art processing techniques, such as those generally discussed in the background section of this application, may be performed to arrive at the formation of the replacement gate cavity 120, as depicted in FIG. 2A.

At the point of fabrication depicted in FIG. 2A, the device 100 includes the remaining portions of a sacrificial gate insulation layer 110, sidewall spacers 118, a layer of epi semiconductor material 112, a liner layer 114 and a layer of insulating material 116. A gate cap layer (not shown), a sacrificial gate electrode (not shown) and portions of the sacrificial gate insulation layer 110 were removed so as to expose the upper surface 106S of the fins 106 and to define the replacement gate cavity 120 between the spacers 118. The device depicted in FIG. 2A may be comprised of a variety of different materials. For example, the sacrificial gate insulation layer 110 may be comprised of silicon dioxide, the sidewall spacers 118 and the liner layer 114 may be comprised of silicon nitride and the layer of insulating material 116 may be comprised of silicon dioxide. The sidewall spacers 118 may be formed by depositing a layer of spacer material and thereafter performing an anisotropic etching process to produce the spacers 118. The illustrative epi semiconductor material 112 was formed in or above the source/drain regions of the device 100. Of course, such epi semiconductor material 112 need not be formed to practice the various inventions disclosed herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 2B:
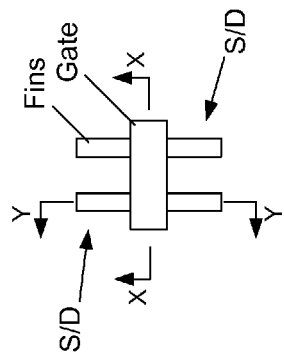
Figure 2B:
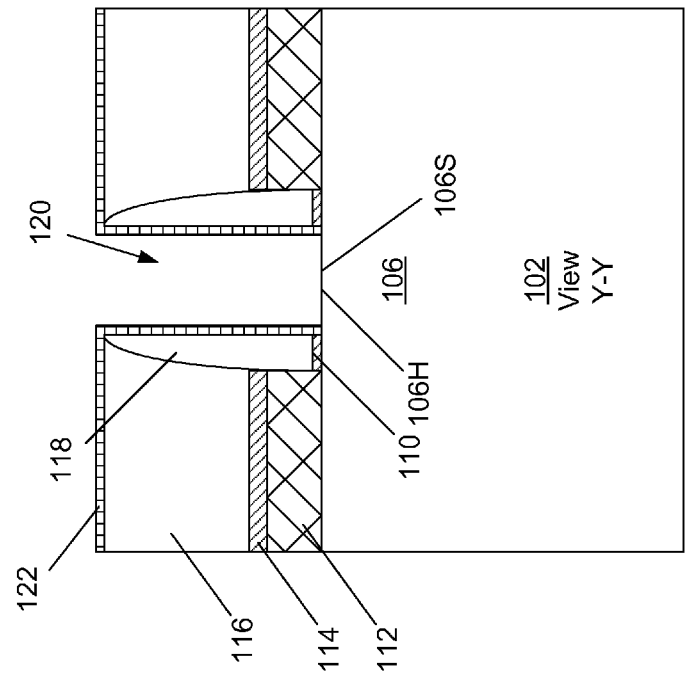
Figure 2B:
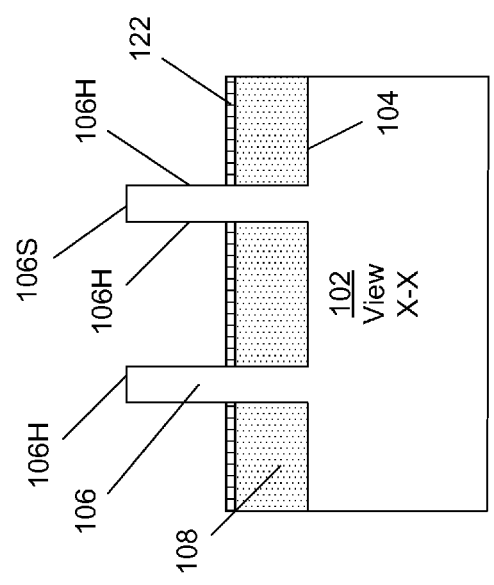

FIG. 2B depicts the device 100 after several process operations were performed. First, a pre-clean process was performed using a dilute hydrogen fluoride (HF) acid (1:10 to 1:1000) to clean any remaining oxide materials from the exposed surfaces of the fins 106. The pre-clean process was also performed so as to make the exposed fin surfaces into hydrogen-terminated (H-terminated) silicon surfaces 106H. A hydrogen terminated surface is a silicon surface wherein the surface silicon atoms are covalently bonded to hydrogen. The presence of an H-terminated surface can be measured using known characterization techniques, such as surface photovoltage measurement techniques. In some embodiments, the H-terminated surface may reflect about 50-100% coverage. The parameters of the pre-clean process may vary depending upon the particular application. In one embodiment, the pre-clean process may be performed for a duration of about 30 seconds at a temperature of about 25° C.

With continuing reference to FIG. 2B, after the pre-clean process was performed, a sacrificial layer 122, e.g., a sacrificial alkylsiloxane layer, was selectively formed on exposed surfaces of the device 100 other than the hydrogen-terminated silicon surfaces 106H. That is, the sacrificial layer 122 forms on the dielectric materials—the spacers 118 and the layers of insulating material 108, 116—but not on the exposed silicon surfaces—the hydrogen-terminated silicon surfaces 106H of the fins 106. The purpose of the sacrificial layer 122 is to prevent formation of certain materials in various process operations that will be performed in manufacturing the final replacement gate structure for the device 100. In one embodiment, the sacrificial alkylsiloxane layer 122 may be a self-assembled monolayer (SAM) that is formed by immersing the device 100 into an alkyltrichlorosilanes ($CH_3$—$(CH_2)_{n-1}SiCl_3$) group solution, such as (OTS) (n=18), and an organic solvent, such as mineral oil. The parameters of the formation process may vary depending upon the particular application. In one embodiment, the alkyltrichlorosilane-containing solution may be at a temperature that falls within the range of about 25-200° C. and the formation process may take about 1 minute. The thickness of the sacrificial alkylsiloxane layer 122 may also vary depending the particular application, e.g., 1-3 nm. The sacrificial alkylsiloxane layer 122 may also be formed using at least some of the principles and techniques set forth in the following publication, which is hereby incorporated by reference in its entirety: Sung et al., "Formation of alkylsiloxane self-assembled monolayers on $Si_3N_4$," *J. Vac. Sci. Technol. A*, 17(2), 1999.

FIG. 2C depicts the device 100 after several layers of material are selectively formed within the replacement gate cavity 120. First, a chemical oxidation process is performed so as to form an interfacial layer of silicon dioxide 124 on the exposed hydrophilic, hydrogen-terminated silicon surfaces 106H. The thickness of the interfacial layer of silicon dioxide 124 may vary depending upon the particular application, e.g., less than 1 nm. The interfacial layer of silicon dioxide 124 need not be formed in all applications. Note that the interfacial layer of silicon dioxide 124 does not form on the sacrificial layer 122 because the oxide material will only form on the exposed silicon surfaces.

With continuing reference to FIG. 2C, a high-k (k value greater than 10) gate insulation layer 126 was selectively formed on the interfacial layer of silicon dioxide 124. The high-k gate insulation layer 126 may be made of a material, such as hafnium oxide (or the other high-k materials noted in the background section of this application), and it may be formed by performing a selective conformal ALD or CVD process. The thickness of the high-k gate insulation layer 126 may vary depending upon the particular application. Note that the high-k gate insulation layer 126 does not form on the sacrificial alkylsiloxane layer 122 for the reasons set forth in Kang et al., "Selective Deposition of Hafnium Oxide Nanothin Films on OTS Patterned Si (100) Substrates by Metal-Organic Chemical Vapor Deposition," *IEEE Transactions on Nanotechnology*, Vol. 5, No. 6, November 2006, which is hereby incorporated by reference in its entirety.

While still referencing FIG. 2C, the next operation involves depositing at least one work-function adjusting metal layer 128 (e.g., a layer of titanium nitride or TiAlC depending upon the type of transistor device being manufactured) on the high-k gate insulation layer 126 and within the replacement gate cavity 120 by performing a selective conformal ALD deposition process. Of course, the work-function adjusting metal layer 128 may be comprised of any of the metals described in the background section of this application and more than one layer of work function metal may be formed in the replacement gate cavity 120, depending upon the particular device under construction. The thickness of the work-function adjusting metal layer 128 may vary depending upon the particular application. Note that the work-function adjusting metal layer 128 does not form on the sacrificial alkylsiloxane layer 122. The work-function adjusting metal layer 128 may be formed using at least some of the principles and techniques set forth in U.S. Pat. No. 7,985,669, which is hereby incorporated by reference in its entirety.

FIG. 2D depicts the device 100 after the sacrificial layer 122 was removed. This results in the formation of gaps 122G that were formerly occupied by the sacrificial layer 122. In one illustrative embodiment, the sacrificial alkylsiloxane layer 122 may be removed by performing a UV curing process at a temperature of about 300° C. to cause the sacrificial alkylsiloxane layer 122 to essentially evaporate.

Next, as shown in FIG. 2E a layer of material 130 was formed on the device 100 by performing a conformal ALD or CVD deposition process so as to fill the gaps 122G. In one embodiment, the layer of material 130 may be comprised of silicon nitride.

FIG. 2F depicts the device 100 after a timed, wet isotropic etching processes was performed to remove portions of the layer of material 130 while leaving other portions of the layer of material 130 in the gaps 122G.

Figure 2G:
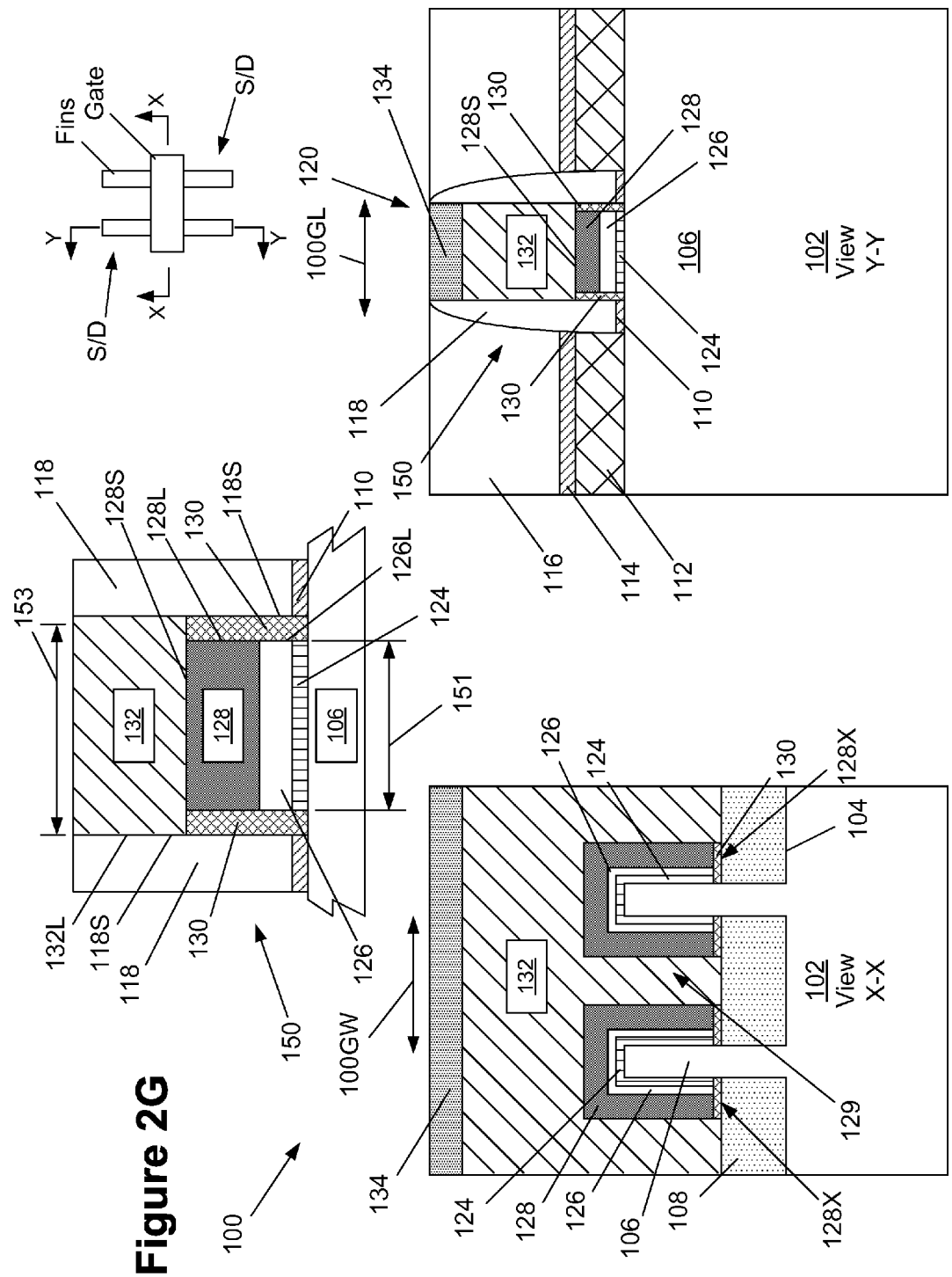

FIG. 2G depicts the device after several process operations were performed to complete the formation of the replacement gate structure 150 and to form a gate cap layer 134. First, a bulk conductive material layer 132, such as tungsten or aluminum, was blanket-deposited above the substrate so as to over-fill the replacement gate cavity 120. Then, an etching process was performed on the conductive material layer 132 such that the desired amount of the conductive material layer 132 remains positioned within the replacement gate cavity 120. This completes the formation of the replacement gate structure 150, i.e., the interfacial layer of silicon dioxide 124 (if present), the high-k gate insulation layer 126, the work-function adjusting metal layer 128 and the bulk conductive material layer 132. Then, the illustrative gate cap layer 134 was formed in the recess above the recessed conductive material layer 132. The gate cap layer 134 may be formed from a variety of materials, e.g., typically silicon nitride. The gate cap layer 134 may be formed by depositing a layer of gate cap material so as to over-fill the recess formed in the replacement gate cavity 120 above the replacement gate structure 150 and, thereafter, performing a CMP process to remove excess portions of the gate cap material layer positioned above the surface of the layer of insulating material 116.

As will be appreciated by those skilled in the art after a complete reading of the present application, there are various novel methods and devices disclosed herein. FIG. 2G contains an enlarged view of a portion of the replacement gate structure 150 wherein it is shown that the high-k gate insulation layer 126 and the work-function adjusting metal layer 128 are laterally positioned (in the gate-length direction 100GL) between the remaining portions of the layer of material 130. The recessed bulk conductive material layer 132 is positioned above the remaining portions of the layer of material 130 and the lateral edges 132L of the recessed bulk conductive material layer 132 and contacts the interior sidewall surface 118S of the spacers 118 thereby occupying the full lateral width of the replacement gate cavity 120. Note also that the bulk conductive material layer 132 does not engage the work-function adjusting metal layer 128 at any location above the substantially planar upper surface 128S of the work-function adjusting metal layer 128. The lateral edges 128L of the work-function adjusting metal layer 128 and the lateral edges 126L of the high-k gate insulation layer 126 contact the remaining portions of the layer of material 130 and do not contact the inner surfaces 118S of the spacers 118. The lateral width 153 of the recessed bulk conductive material layer 132 is wider than the lateral width 151 of the work-function adjusting metal layer 128 and the high-k gate insulation layer 126.

Also note that, using the methods disclosed herein, the work-function adjusting metal layer 128 has a substantially planar upper surface 128S that spans across the replacement gate cavity 120 (in the gate length direction 100GL of the device 100) on the fins 106 between the opposing remaining portions of the layer of material 130. Additionally, for the illustrative FinFET device 100 depicted in the drawings, in the gate width direction 100GW of the device, spaced-apart regions 128X of the collection of the high-k gate insulation layer 126, the work-function adjusting metal layer 128 and the interfacial layer of silicon dioxide 124 (when present) are formed above the fins 106. The spaced-apart regions 128X are formed because the materials 124, 126 and 128 do not form on the alkylsiloxane layer 122 positioned on the layer of insulating material 108. In the depicted example, the spaced-apart regions 128X are separated by an illustrative space 129. Of course, for a single fin FinFET device (not shown) there would only be a single region 128X.

FIG. 2H is an example of an embodiment of a planar device 103 that may be fabricated using the methods disclosed herein. The processing steps would be basically those depicted in the Y-Y views of the previous drawings. For the planar device 103, isolation regions 111 are depicted as having been formed in the substrate 102. The structure and configuration of the replacement gate structure 150 when viewed in a cross-sectional view taken in the gate-length direction 101GL is the same for both planar and FinFET devices. However, for the planar device 103, the materials 124, 126 and 128 would span across the replacement gate cavity 120 (in the gate width direction 101GW of the device 103) above the planar substrate 102 between the opposing layers of material 130, as depicted in view X-X. As before, the bulk conductive material layer 132 does not engage the work-function adjusting metal layer 128 at any location above the substantially planar upper surface 128S of the work-function adjusting metal layer 128. The lateral edges 128L of the work-function adjusting metal layer 128 and the lateral edges 126L of the high-k gate insulation layer 126 contact the remaining portions of the layer of material 130 and do not contact the inner surfaces 118S of the spacers 118. The lateral width 155 of the recessed bulk conductive material layer 132 in the gate width direction 101GW is wider than the lateral width 157 of the work-function adjusting metal layer 128 and the high-k gate insulation layer 126.

Another unique aspect of the presently disclosed inventions is that, using the methods disclosed herein, the high-k gate insulation layer 126 and the work-function adjusting metal layer 128 are not formed on the sacrificial layer 122 above the upper surface 128S of the work-function adjusting metal layer 128, i.e., in the vertical area indicated by the double arrowed line 121 shown in FIG. 2C. Thus, the work-function chamfering process described in the background section of this application need not be performed, thereby avoiding the time and problems associated with that activity that has to be performed when using prior art replacement gate manufacturing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a replacement gate structure for a device above a silicon substrate, comprising:
    performing at least one first etching process to remove a sacrificial gate structure positioned between two spaced-apart sidewall spacers so as to thereby define a replacement gate cavity that exposes a surface of said substrate;
    performing a process operation on said exposed surface of said substrate so as to form an H-terminated silicon surface;
    selectively forming a sacrificial material layer at least on internal surfaces of said sidewall spacers within said replacement gate cavity but not on said H-terminated silicon surface;
    forming a high-k layer of insulating material within said replacement gate cavity above said H-terminated silicon surface and laterally between first spaced-apart portions of said sacrificial material layer formed on said sidewall spacers;
    forming at least one work-function adjusting metal layer above said high-k layer of insulating material and laterally between second spaced-apart portions of said sacrificial material layer formed on said sidewall spacers, said at least one work-function adjusting metal having a substantially planar upper surface that extends between said second spaced-apart portions of said sacrificial material layer formed on said sidewall spacers; and
    after forming said at least one work-function adjusting metal layer, removing said sacrificial material layer.

2. The method of claim 1, wherein performing said process operation comprises performing a dilute HF acid cleaning process on said exposed surface of said substrate so as to form said H-terminated silicon surface.

3. The method of claim 1, wherein selectively forming said sacrificial material layer comprises selectively forming a sacrificial alkylsiloxane layer.

4. The method of claim 3, wherein selectively forming said alkylsiloxane layer comprises immersing said device in an alkyltrichlorosilanes ($CH_3$—$(CH_2)_{n-1}SiCl_3$) group solution.

5. The method of claim 1, wherein selectively forming said sacrificial material layer comprises performing a directed self-assembly process to form a self-assembled monolayer of said sacrificial material.

6. The method of claim 1, wherein said device is a FinFET device and said exposed surface of said silicon substrate is part of a fin structure defined in said substrate.

7. The method of claim 1, wherein removing said sacrificial material layer comprises removing said sacrificial material layer so as to form spaces between said sidewall spacers and said at least one work-function adjusting metal and said high-k layer of insulating material.

8. The method of claim 7, further comprising filling said spaces with an insulating material.

9. The method of claim 8, wherein filing said spaces comprises depositing an insulating material in said replacement gate cavity and into said spaces and performing an isotropic etching process so as to leave portions of said deposited insulating material positioned in said spaces.

10. The method of claim 1, further comprising:
    forming a bulk conductive material within said replacement gate cavity above and in contact with said substantially planar upper surface of said at least one work-function adjusting metal; and
    forming a gate cap layer within said replacement gate cavity above said bulk conductive material.

11. The method of claim 1, wherein said sidewall spacers are comprised of one of silicon nitride, carbon-doped silicon nitride, boron-doped silicon nitride or silicon dioxide.

12. A method forming a replacement gate structure for a device above a silicon substrate, comprising:
    performing at least one first etching process to remove a sacrificial gate structure positioned between two spaced-apart sidewall spacers so as to thereby define a replacement gate cavity that exposes a surface of said substrate;
    performing a dilute HF acid cleaning process on said exposed surface of said substrate so as to form an H-terminated silicon surface;
    selectively forming a sacrificial alkylsiloxane layer at least on internal surfaces of said sidewall spacers within said replacement gate cavity but not on said H-terminated silicon surface by immersing said device in an alkyltrichlorosilanes ($CH_3$—$(CH_2)_{n-1}SiCl_3$) group solution;

forming a high-k layer of insulating material within said replacement gate cavity above said H-terminated silicon surface and laterally between first spaced-apart portions of said sacrificial alkylsiloxane layer formed on said sidewall spacers;

forming at least one work-function adjusting metal layer above said high-k layer of insulating material and laterally between second spaced-apart portions of said sacrificial alkylsiloxane layer formed on said sidewall spacers, said at least one work-function adjusting metal having a substantially planar upper surface that extends between said second spaced-apart portions of said sacrificial alkylsiloxane layer formed on said sidewall spacers; and after forming said at least one work-function adjusting metal layer, removing said sacrificial alkylsiloxane layer.

13. The method of claim 12, wherein removing said sacrificial alkylsiloxane layer comprises removing said sacrificial alkylsiloxane layer so as to form spaces between said sidewall spacers and said at least one work-function adjusting metal and said high-k layer of insulating material.

14. The method of claim 13, further comprising filling said spaces with an insulating material.

15. The method of claim 14, wherein filing said spaces comprises depositing an insulating material in said replacement gate cavity and said spaces and performing an isotropic etching process so as to leave portions of said deposited insulating material positioned in said spaces.

16. The method of claim 12, further comprising:
forming a bulk conductive material within said replacement gate cavity above and in contact with said substantially planar upper surface of said at least one work-function adjusting metal; and
forming a gate cap layer within said replacement gate cavity above said bulk conductive material.

17. The method of claim 12, wherein selectively forming said sacrificial alkylsiloxane layer comprises performing a directed self-assembly process to form a self-assembled monolayer of said sacrificial alkylsiloxane layer.

18. A method of forming a replacement gate structure for a device above a silicon substrate, comprising:
performing at least one first etching process to remove a sacrificial gate structure positioned between two spaced-apart sidewall spacers so as to thereby define a replacement gate cavity that exposes a surface of said substrate;
performing a process operation on said exposed surface of said substrate so as to form an H-terminated silicon surface;
selectively forming a sacrificial material layer at least on internal surfaces of said sidewall spacers within said replacement gate cavity but not on said H-terminated silicon surface, wherein selectively forming said sacrificial material layer comprises performing a directed self-assembly process to form a self-assembled monolayer of said sacrificial material;
forming a high-k layer of insulating material within said replacement gate cavity above said H-terminated silicon surface and laterally between first spaced-apart portions of said sacrificial material layer formed on said sidewall spacers; and
forming at least one work-function adjusting metal layer above said high-k layer of insulating material and laterally between second spaced-apart portions of said sacrificial material layer formed on said sidewall spacers, said at least one work-function adjusting metal having a substantially planar upper surface that extends between said second spaced-apart portions of said sacrificial material layer formed on said sidewall spacers.

* * * * *

UNITED STATES PATENT AND TRADEMARK OFFICE
CERTIFICATE OF CORRECTION

Page 1 of 1

PATENT NO. : 9,437,711 B2
APPLICATION NO. : 14/081019
DATED : September 6, 2016
INVENTOR(S) : Xiuyu Cai et al.

It is certified that error appears in the above-identified patent and that said Letters Patent is hereby corrected as shown below:

In the Claims

Col. 14, line 53 (claim 12, line 1), after "method" insert --of--.

Signed and Sealed this
Eighteenth Day of October, 2016

Michelle K. Lee
*Director of the United States Patent and Trademark Office*